(12) United States Patent
Vaara

(10) Patent No.: US 7,324,799 B2
(45) Date of Patent: Jan. 29, 2008

(54) MULTIBAND MIXER

(75) Inventor: Sami Vaara, Turku (FI)

(73) Assignee: Nokia Corporation, Espoo (FI)

( * ) Notice: Subject to any disclaimer, the term of this patent is extended or adjusted under 35 U.S.C. 154(b) by 500 days.

(21) Appl. No.: 10/459,094

(22) Filed: Jun. 10, 2003

(65) Prior Publication Data

US 2004/0253938 A1 Dec. 16, 2004

(51) Int. Cl.
*H04B 1/16* (2006.01)
(52) U.S. Cl. ............... 455/334; 455/118; 455/127.2; 455/127.3; 327/359
(58) Field of Classification Search .......... 455/116, 455/118, 127.1, 127.2, 127.3, 127.4, 334; 327/359
See application file for complete search history.

(56) References Cited

U.S. PATENT DOCUMENTS

| | | | | |
|---|---|---|---|---|
| 5,212,817 | A * | 5/1993 | Atkinson | 455/161.2 |
| 6,134,452 | A * | 10/2000 | Hufford et al. | 455/552.1 |
| 6,959,178 | B2 * | 10/2005 | Macedo et al. | 455/313 |
| 2002/0177465 | A1 | 11/2002 | Robinett | 455/552 |
| 2004/0069852 | A1 | 4/2004 | Seppinen et al. | |
| 2004/0214537 | A1* | 10/2004 | Bargroff et al. | 455/136 |
| 2005/0014476 | A1* | 1/2005 | Oono et al. | 455/118 |

FOREIGN PATENT DOCUMENTS

| | | | |
|---|---|---|---|
| EP | 0 798 880 | * | 10/1997 |
| EP | 0798880 A2 | | 10/1997 |
| EP | 1006669 A1 | | 6/2000 |
| EP | 1 073 205 | * | 7/2000 |
| EP | 1 073 205 | | 1/2001 |

OTHER PUBLICATIONS

"A Highly Integrated Dual-band Triple-Mode Transmit IC for CDMA2000 Applications", Aggarwal et al., Proceedings of the 2002 Bipolar/BICMOS Circuits and Technology Meeting, pp. 57-60.

* cited by examiner

*Primary Examiner*—Nay Maung
*Assistant Examiner*—Tuan H. Nguyen

(57) ABSTRACT

The invention relates to a device for frequency conversion, comprising exactly one multi-band mixer (3) with means for transferring a signal (2) that is applied to the signal input of said multi-band mixer (3) from said signal's source frequency band to one out of a plurality of target frequency sub-bands at a time, yielding a transferred signal (4) at the signal output of said multi-band mixer (3), wherein said plurality of target frequency sub-bands defines at least a first and a second target frequency band, and a bank of switchable Variable Gain Amplifiers (VGAs) (5-1, 5-2) for amplifying said transferred signal (4), wherein for each of said target frequency bands, one switchable VGA (5-1, 5-2) is provided that is adapted to said target frequency band and is connected to the signal output of said multi-band mixer (3). The invention also relates to a method for frequency conversion.

15 Claims, 3 Drawing Sheets

MULTIBAND MIXER

FIELD OF THE INVENTION

The invention relates to a device for frequency conversion, comprising a mixer with means for transferring a signal that is applied to the signal input of said mixer from said signal's source frequency band to one out of a plurality of target frequency sub-bands at a time, yielding a transferred signal at the signal output of said mixer, wherein said plurality of target frequency sub-bands defines at least a first and a second target frequency band, and a bank of at least two switchable Variable Gain Amplifiers (VGAs) for amplifying said transferred signal, wherein each of said switchable VGAs is adapted to one of said target frequency bands and is connected to the signal output of said mixer.

BACKGROUND OF THE INVENTION

In a variety of application fields of signal transmission, such as e.g. cable or broadcast radio and television or mobile radio, information-carrying base-band signals are transmitted as band-pass signals (also denoted as Radio Frequency (RF) signals) in higher frequency bands (at RF frequencies). The reasons for RF transmission are manifold: Higher frequency bands are usually more suitable for signal transmission via space or via transmission lines that are shared among several transmitters and receivers; the shift of the frequency band allows for the application of various modulation techniques that can be adapted to the characteristics of the transmission channel (space or cable); the spectrum of the information-carrying base-band signals can be modified by the frequency transformation to allow for a more efficient use of the available transmission bandwidth (spreading or compression of the spectrum); Frequency Division Multiplex (FDM) can be applied by transmitting the information-carrying base-band signals of several information sources in adjacent small RF sub-bands (RF channels), where each RF sub-band has the same bandwidth, but different center frequencies.

In today's digital mobile radio systems, such as for instance the Global System for Mobile Communications (GSM), in general more than one frequency band is available for RF transmission. GSM in Europe uses two frequency bands of 25 MHz bandwidth centered at 900 MHz (GSM900) and 1800 MHz (GSM1800), respectively, wherein each of these frequency bands comprises an up-link (information transfer from mobile station to base station) and a down-link (information transfer from base station to mobile station) frequency band, and wherein each of these up- and down-link bands further comprises a plurality of FDM sub-bands (RF channels) of 200 kHz bandwidth each. In the US, said frequency bands are centered at 850 and 1900 MHz, respectively.

A dual-band European GSM mobile phone is capable of transmitting and receiving in both the GSM900 and GSM1800 band. The basic set-up of a RF transmitter for such a dual-band phone is depicted in FIG. 1.

FIG. 1 shows an I/Q-Filter 1, that low-pass filters the I/Q-modulated base-band signal that is output by a GSM modulator (not shown), yielding a filtered I/Q-modulated base-band signal 2. GSM uses Gaussian Minimum Shift Keying (GMSK) or 8-Phase Shift Keying (8-PSK) as modulation techniques, so that the modulated complex-valued base-band signal can be represented by an Inphase (I) component and Quadrature (Q) component. The transfer of the I/Q-modulated base-band signal to the RF frequency bands with center frequencies of 900 or 1800 MHz is accomplished by the mixers 3-1 and 3-2, respectively. Mixer 3-1 is capable of transferring the I/Q-modulated signal applied to its input to the lower GSM900 band, whereas mixer 3-2 is capable of transferring the I/Q-modulated signal applied to its input to the GSM1800 band. The signal at the outputs of the mixers 3-1 and 3-2 are denoted as transferred signals 4-1 and 4-2, respectively. Note that, in the process of mixing, the I/Q-modulated signal is transferred to the center frequency of the RF sub-band (the RF channel) the mobile phone was assigned to, i.e. to a center frequency in the range 900±25/2 MHz and 1800±25/2 MHz. Each mixer 3-1, 3-2 comprises a Voltage-Controlled Oscillator (VCO) for generating the required RF sub-band center frequency, and a Phase-Locked-Loop (PLL) circuit that controls the VCO in order to accurately maintain said RF sub-band frequency. The bandwidth (around 25 MHz) and center frequency (900 or 1800 MHz) of the frequency band that can be covered by each mixer 3-1, 3-2 is thus defined by the deployed VCO and PLL. The transferred signals 4-1 or 4-2 are then fed into Variable Gain Amplifiers (VGAs) 5-1 and 5-2 for the GSM900 and GSM1800 band, respectively, yielding amplified transferred signals 6-1 and 6-2, respectively. The design of the VGAs 5-1 and 5-2 generally depends on the frequency of the signals that are to be amplified, so that the VGAs 5-1 and 5-2 are different. The amplified transferred signals 6-1 and 6-2 are then fed into power amplifiers 7-1 and 7-2, respectively, and the output signals 8-1 and 8-2 of said power amplifiers 7-1 and 7-2 are transmitted by the transmit antennas 9-1 and 9-2 corresponding to the GSM900 and GSM1800 band, respectively. Note that the design of the power amplifiers 7-1 and 7-2 and the transmit antennas 9-1 and 9-2 depend on the frequency of the input signals as well.

SUMMARY OF THE INVENTION

In prior art dual-band mobile phones, two mixers 3-1 and 3-2 are provided, so that the filtered I/Q-modulated base-band signal 2 can be transferred to both the GSM900 and GMS1800 bands. Providing two mixers increases the size of the silicon area required for the RF hardware and thus increases both the costs and the size of a dual-band mobile phone.

Motivated by these disadvantages encountered in the RF hardware of prior art dual-band mobile phones, it is thus the object of the invention to provide a more efficient device and method for frequency conversion of a signal from a source frequency band to a sub-band of at least two different target frequency bands.

The object of the invention is solved by proposing that a device for frequency conversion comprises exactly one multi-band mixer with means for transferring a signal that is applied to the signal input of said multi-band mixer from said signal's source frequency band to one out of a plurality of target frequency sub-bands at a time, yielding a transferred signal at the signal output of said multi-band mixer, wherein said plurality of target frequency sub-bands defines at least a first and a second target frequency band; and a bank of switchable Variable Gain Amplifiers (VGAs) for amplifying said transferred signal, wherein for each of said target frequency bands, one switchable VGA is provided that is adapted to said target frequency band and is connected to the signal output of said multi-band mixer.

The multi-band mixer according to the present invention is able to transfer the signal that is applied to its input to one target frequency sub-band at a time, where said target frequency sub-band is located in one of at least first and second target frequency bands. The signal does not necessarily have to be a base-band signal, and also the transfer of a signal from an intermediate frequency band to a target sub-band in one of at least first and second RF frequency bands is possible. The signal that has been transferred to a target frequency sub-band in one of at least a first and second target frequency band by the multi-band mixer is output from the signal output of the multi-band mixer and subsequently input to all switchable VGAs in said bank of switchable VGAs. Each of said switchable VGAs is frequency-dependent and may for instance be optimized for the center frequency of exactly one of said at least first and second target frequency bands, so that for all target frequency sub-bands that lie within one of said target frequency bands, optimum amplification or a reduced noise contribution is achieved. In contrast to prior art solutions, thus only one multi-band mixer instead of several single-band mixers is used, which vastly reduces the required silicon area and simplifies the layout of the RF transmitter. As in the prior art, separate frequency-dependent VGAs still have to be provided for each frequency band, but the VGAs according to the present invention have to be switchable.

The device according to the present invention preferably further comprises means for controlling the switching of said switchable VGAs in said bank of VGAs so that only the VGA that is adapted to said target frequency band that contains the target frequency sub-band the signal has been transferred to has an amplification factor larger than zero and so that all other VGAs in said bank of VGAs have an amplification factor equal or close to zero. The transferred signal is thus only amplified by that switchable VGA in the bank of VGAs that corresponds to the target frequency band that contains the target frequency sub-band the signal has been transferred to by the multi-band mixer. The switching of the switchable VGAs may for example be controlled by a bias signal. The means for controlling the switching of said switchable VGAs then represents a control instance that outputs the bias signals, where the bias signal input ports of the VGA then represent the interface between the switchable VGA and the means for controlling the switching of said switchable VGAs. Note that the adjustment of the gain of said VGA may be handled separately from or jointly with the control of the switching.

According to the present invention, it is further preferred that the device further comprises a bank of Power Amplifiers (PAs), wherein for each of said target frequency bands, one PA is provided that is adapted to said target frequency band and is connected to the signal output of that switchable VGA that is adapted to the same target frequency band, respectively. After amplification with a switchable VGA that is designed for that target frequency band that contains the target frequency sub-band the signal has been transferred to, the transferred and amplified signal is further amplified by a PA, which also corresponds to one of said target frequency bands, i.e. is designed for maximum amplification of the transferred amplified signal or less generation of noise for the center frequency of said target frequency band. The PAs in the bank of PAs may also be switchable, but need not be switchable, because due to the switching of the preceding switchable VGAs in the bank of switchable VGAs, only the output of one of said switchable VGAs produces a non-zero signal, and, correspondingly, only at the input of one PA, a non-zero signal is present.

According to the present invention, is it preferred that said signal is an I/Q-modulated base-band signal, and that said multi-band mixer comprises means for combining said I/Q-modulated base-band signal with sinusoids the frequency of which corresponds to said target frequency sub-band. Said signal thus may for instance be a GMSK, 2-PSK, 4-PSK or 8-PSK complex-valued base-band signal, which can be represented by an Inphase (I) and Quadrature (Q) component.

According to the present invention, it is further preferred that said multi-band mixer comprises a tuneable Voltage-Controlled Oscillator (VCO) and a Phase-Locked-Loop (PLL) circuit. The VCO generates the frequency for said sinusoids in accordance to the center frequency of the target frequency sub-band the signal is transferred to.

A preferred embodiment of the present invention is represented by a device for frequency conversion that comprises exactly one multi-band mixer with means for transferring a signal that is applied to the signal input of said multi-band mixer from said signal's source frequency band to one out of a plurality of target frequency sub-bands at a time, yielding a transferred signal at the signal output of said multi-band mixer, wherein said plurality of target frequency sub-bands defines at least a first and a second target frequency band; and a bank of switchable Variable Gain Amplifiers (VGAs) for amplifying said transferred signal, wherein for each of said target frequency bands, one switchable VGA is provided that is adapted to said target frequency band and is connected to the signal output of said multi-band mixer; wherein said multi-band mixer comprises a first and a second group of transistors; wherein each of said switchable VGAs comprises a first and a second transistor; wherein the emitter of said first transistor of each of said switchable VGAs is connected to all collectors of the transistors of said first group of transistors of said multi-band mixer, respectively, in the form of a cascode circuit; and wherein the emitter of said second transistor of each of said switchable VGAs is connected to all collectors of the transistors of said second group of transistors of said multi-band mixer, respectively, in the form of a cascode circuit.

A cascode circuit thus is formed by the first transistor of the first switchable VGA and each single transistor in the first group of transistors of the multi-band mixer, or by the second transistor of the first switchable VGA and each single transistor in the second group of transistors of the multi-band mixer, etc. The cascode circuit that is composed of a transistor in each switchable VGA and a transistor in the multi-band mixer has the advantage that switching between the frequency bands is performed by current and not by voltage, so that interference with other parts of the RF transmitter can be reduced. This is due to the fact that in switching by current, the oscillations of the voltage are low because of the low node impedance at the emitter of the switchable VGAs. In addition, in the cascode circuit, no switches are present in the RF signal path.

The preferred embodiment of the present invention may advantageously further comprise means for controlling the switching of said switchable VGAs in said bank of VGAs so that only the VGA that is adapted to said target frequency band that contains the target frequency sub-band the signal has been transferred to has an amplification factor larger than zero and so that all other VGAs in said bank of VGAs have an amplification factor equal or close to zero, wherein the bases of said first and second transistors of each of said switchable VGAs are connected to said means for controlling the switching of said switchable VGAs, respectively.

According to the preferred embodiment of the present invention, it is further advantageous that said signal is an I/Q-modulated base-band signal; that said multi-band mixer comprises means for combining said I/Q-modulated base-band signal with sinusoids the frequency of which corresponds to said target frequency sub-band; and that the bases of the transistors of said first and second group of transistors of said multi-band mixer are modulated with signals that are generated by circuitry that combines said sinusoids with said I/Q-modulated base-band signal.

The preferred embodiment of the present invention is advantageously a device, wherein the device comprises means for controlling the switching of said switchable VGAs in said bank of VGAs so that only the VGA that is adapted to said target frequency band that contains the target frequency sub-band the signal has been transferred to has an amplification factor larger than zero and so that all other VGAs in said bank of VGAs have an amplification factor equal or close to zero, and wherein each of said switchable VGAs further comprises a third and fourth transistor and a waste branch, wherein the collectors of said third and fourth transistors are connected to said waste branch, wherein the emitters of said third and fourth transistor are connected to the emitters of said first and second transistors, respectively, wherein the bases of said third and fourth transistors are connected to said means for controlling the switching of said switchable VGAs, wherein the bases of said first and second transistors are connected to said means for controlling the switching of said switchable VGAs, and wherein all the emitters of said first and second group of transistors of said multi-band mixer are connected to ground directly or by means of further electronic components.

The object of the invention is further solved by proposing that a method for frequency conversion comprises the steps of transferring a signal that is applied to the signal input of a multi-band mixer from said signal's source frequency band to one out of a plurality of target frequency sub-bands at a time, yielding a transferred signal at the signal output of said multi-band mixer, wherein said plurality of target frequency sub-bands defines at least a first and a second target frequency band; and amplifying said transferred signal in a bank of switchable Variable Gain Amplifiers (VGAs), wherein for each of said target frequency bands, one switchable VGA is provided that is adapted to said target frequency band and is connected to the signal output of said multi-band mixer.

The method according to the present invention preferably comprises the step of controlling the switching of said switchable VGAs in said bank of VGAs so that only the VGA that is adapted to said target frequency band that contains the target frequency sub-band the signal has been transferred to has an amplification factor larger than zero and so that all other VGAs in said bank of VGAs have an amplification factor equal or close to zero.

According to the method of the present invention, it is preferred that said signal is an I/Q-modulated base-band signal and that said I/Q-modulated base-band signal are combined in said multi-band mixer with sinusoids the frequency of which corresponds to said target frequency sub-band.

BRIEF DESCRIPTION OF THE FIGURES

These and other aspects of the invention will be apparent from and elucidated with reference to the embodiments described hereinafter. In the figures show.

DETAILED DESCRIPTION OF THE INVENTION

Figure 1:
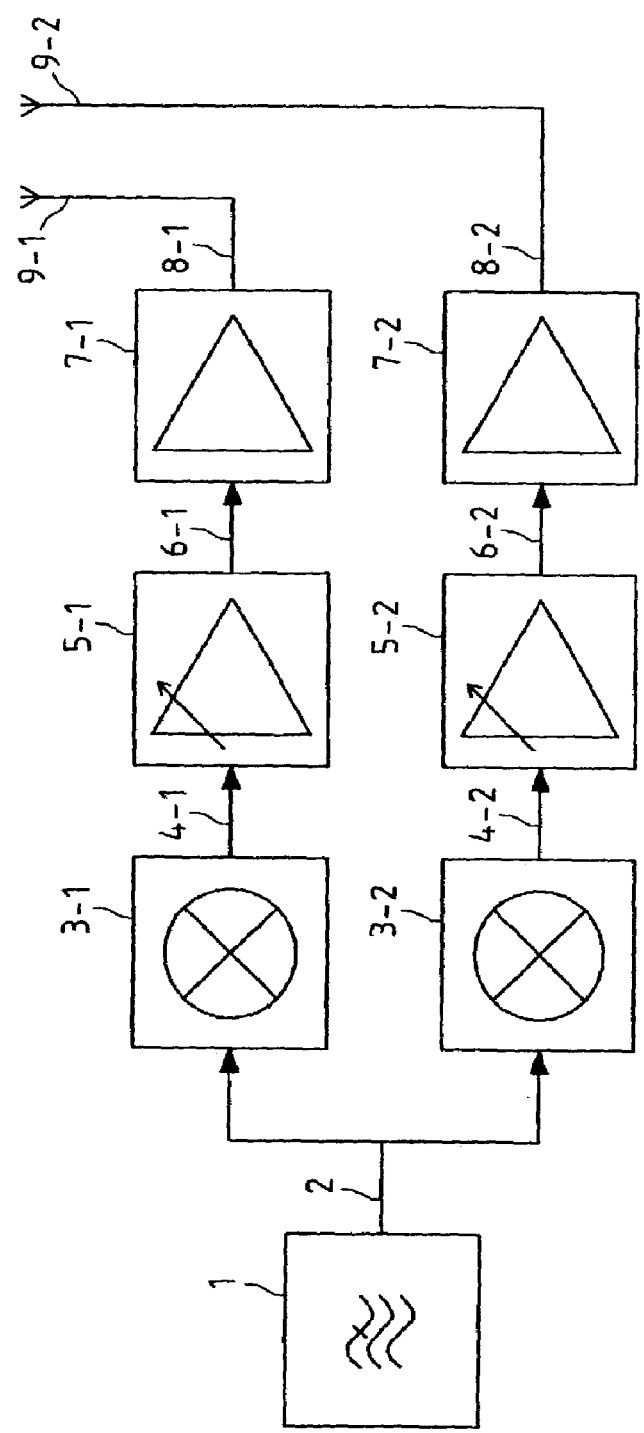
FIG. 1: A block diagram of a prior art dual-band RF transmitter.
Figure 2:
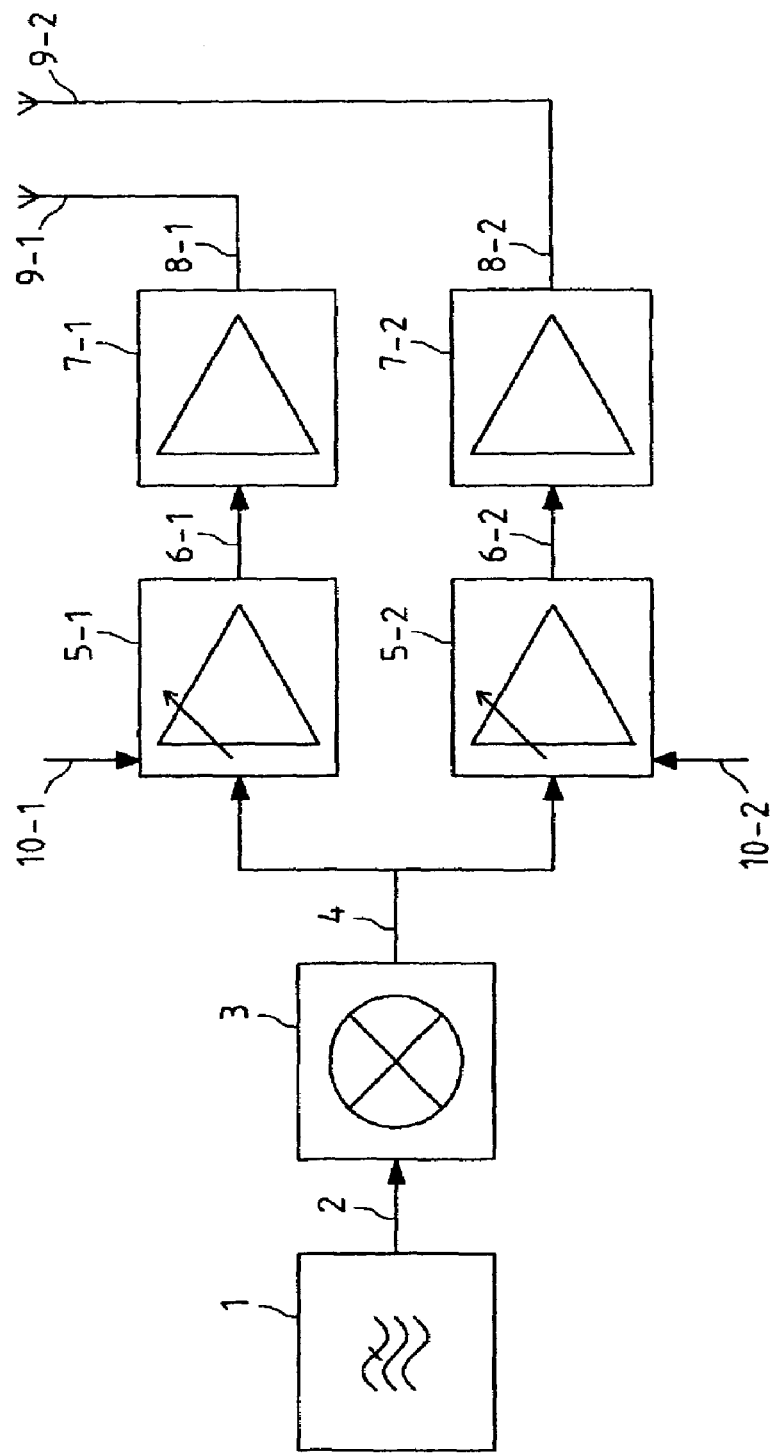
FIG. 2: a block diagram of a dual-band RF transmitter according to the present invention.

FIG. 2 depicts a block diagram of a dual-band RF transmitter according to the present invention. Similar to the prior art RF transmitter as illustrated in FIG. 1, a filtered I/Q-modulated base-band signal 2 is output by an I/Q-Filter 1. However, in the RF transmitter according to the present invention, the I/Q-modulated signal 2 is only fed into one mixer, this mixer being a multi-band mixer 3, yielding a transferred signal 4. The I/Q-modulated signal is thus transferred from the source frequency band it originally resided in to a target frequency sub-band that may lie in a first or a second target frequency band, e.g. the GSM900 or the GSM1800 frequency band. The fact that only one multi-band mixer instead of the two mixers required in the prior art is used vastly reduces the silicon area the RF transmitter is mounted on. The multi-band mixer may comprise two oscillators for generating the center frequencies of the target sub-bands in the first and second target bands, respectively, or one tuneable oscillator that is capable of generating the center frequencies for both target bands, for instance a Voltage Controlled Oscillator (VCO). An alternative solution may also provide one oscillator and a frequency divider, depending on the desired target frequency ranges. In any case, a Phase-Locked-Loop (PLL) is used to control and stabilize the generated frequencies. The transferred signal 4 then is fed into switchable VGAs 5-1 and 5-2, respectively. The VGAs are optimized for either of the target frequency ranges, i.e. VGA 5-1 may be optimized for a center frequency of 900 MHz and VGA 5-2 may be optimized for a center frequency of 1800 MHz. Both VGAs comprise bias inputs 10-1 and 10-2 that allow for the control of the switching of said switchable VGAs. E.g., in the case that the signal 2 is to be transferred to the GSM900 target frequency band, VGA 5-1 that is adapted to the GSM900 band is controlled by means of its bias input 10-1 to amplify the transferred signal 4, yielding the amplified transferred signal 6-1. The bias input 10-2 of VGA 5-2 then is set to zero in order to prevent the switchable VGA 5-2 to generate a non-zero output signal 6-2. The amplified transferred signal 6-1 then is further amplified by power amplifier 7-1, yielding the signal 8-1 that finally is transmitted by antenna 9-1. The signal path through power amplifier 7-2 and antenna 9-2 is not used in this case.

Figure 3:
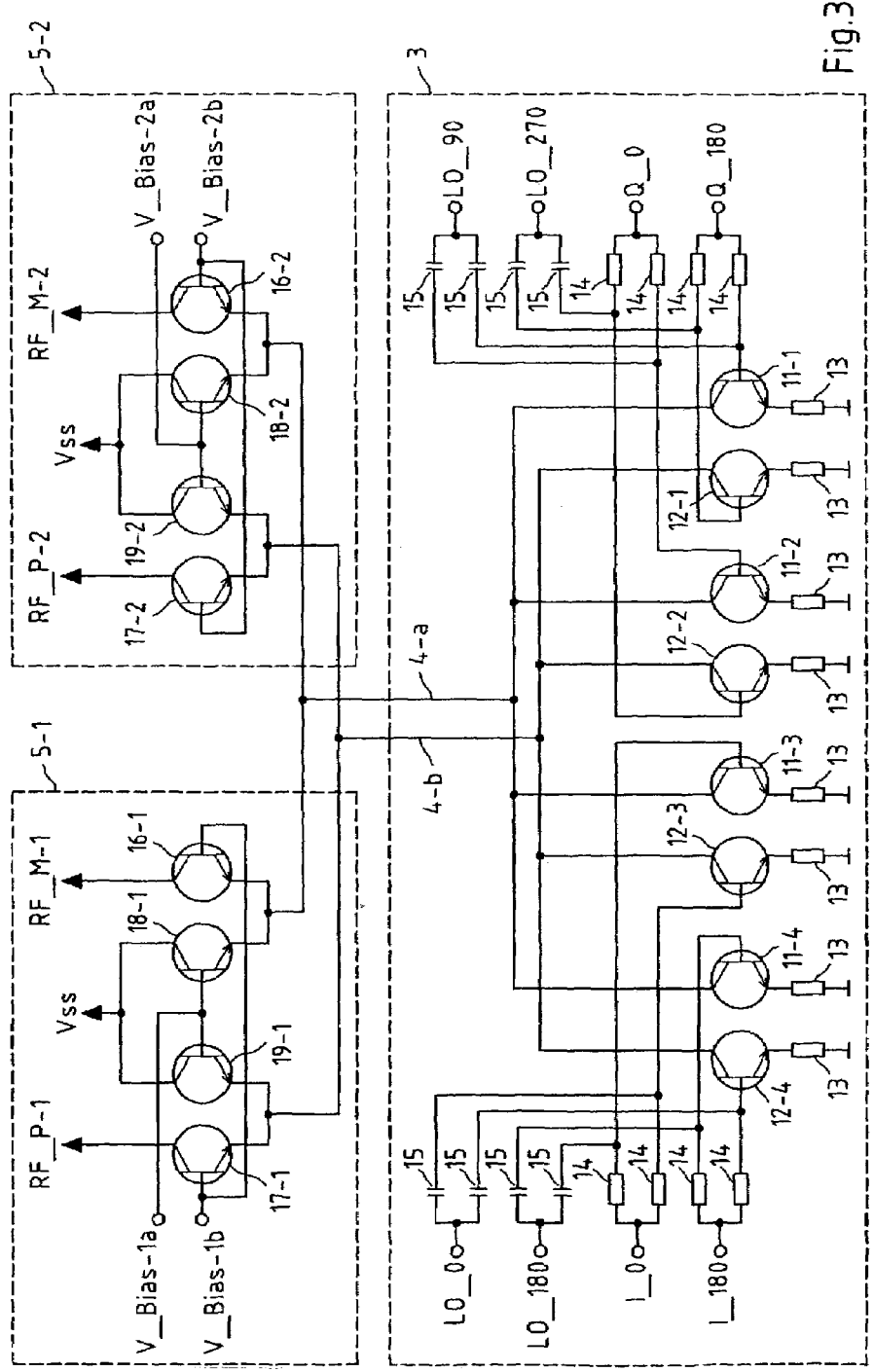
FIG. 3: a circuit diagram of a preferred embodiment of a frequency conversion device according to the present invention with a multi-band mixer and multiple VGAs in a cascode structure.

FIG. 3 depicts a circuit diagram of a preferred embodiment of a frequency conversion device according to the present invention with a multi-band mixer 3 and two VGAs 5-1 and 5-2, that are connected to the multi-band mixer 3 to form a plurality of cascode circuits.

Within the multi-band mixer 3, a local oscillator, e.g. a VCO that is controlled by a PLL, generates four phase-shifted sinusoids that are denoted as LO_0, LO_90, LO_180 and LO_270, that represent a sine, cosine, negative sine and negative cosine signal with a frequency that corresponds to the center frequency of the target frequency sub-band the signal is to be transferred to. The multi-band mixer is broadband enough so that all desired target frequency sub-bands within both target frequency bands GSM900 and GSM1800 can be accurately generated. Said phase-shifted sinusoids are combined with the signals from inphase inputs I_0 and I_180 and quadrature inputs Q_9 and Q_180, where said signals represent an I/Q-modulated base-band signal and may for instance take the shape of 66.7 kHz sine/cosine waves with different phases that stem from GMSK or PSK modulation. Both the I- and the Q-inputs are thus fed with sinusoids that are modulated with binary signals (0,1) and, in comparison to the RF frequency of several 100 MHz, can be considered as base-band signals.

The multi-band mixer 3 also comprises a first group of transistors 11-1 . . . 11-4 and a second group of transistors 12-1 . . . 12-4. The emitters of all of said transistors are connected to ground via resistors 13. The collectors of all transistors 11-1 . . . 11-4 of the first group are connected with each other and to the signal output 4-$a$ of the multi-band mixer, and equivalently the collectors of all transistors 12-1 . . . 12-4 of the second group of transistors are connected with each other and to the signal output 4-$b$ of the multi-band mixer. The bases of the transistors 11-1 . . . 11-4 of the first group of transistors are modulated with the combination of the signals (Q_180, LO_90), (Q_0, LO_90), (I_0, LO_180) and (I_180, LO_180), respectively, where said combination is achieved by connecting the I/Q-inputs to said bases via resistors 14 and by connecting the LO-inputs to said bases via capacitors 15, respectively. The combination of the I/Q-inputs and the LO-signals represents a multiplication of the low-frequency signals present at the I/Q-inputs with the high-frequency LO-signals.

Similarly, the bases of the transistors 12-1 . . . 12-4 of the second group of transistors are modulated with the combination of the signals (Q_180, LO_270), (Q_0, LO_270), (I_0, LO_0) and (I_180, LO_0), respectively, where said combination is achieved by connecting the I/Q-inputs to said bases via resistors 14 and by connecting the LO-inputs to said bases via capacitors 15, respectively.

Within the switchable VGA 5-1, the collectors of a first transistor 16-1 and a second transistor 17-1 are connected to the negative RF signal output RF_M-1 and positive RF signal output RF_P-1 respectively, which lead to a PA (not shown). The bases of the transistors 16-1 and 17-1 are both connected to the VGA bias signal input V_Bias-1$b$. The emitter of the first transistor 16-1 is connected to the signal output 4-$a$ of the multi-band mixer, which in turn is connected to the collectors of all transistors 11-1 . . . 11-4 of the first group of transistors in the multi-band mixer, and the emitter of the second transistor 17-1 is connected to the signal output 4-$b$ of the multi-band mixer, which in turn is connected to the collectors of all transistors 12-1 . . . 12-4 of the second group of transistors in the multi-band mixer. Thus the first transistor 16-1 in the switchable VGA 5-1 and the transistors 11-1 . . . 11-4 in the first group of transistors of the multi-band mixer 3 form a cascode circuit, where the input ports of the cascode circuits are the bases of the transistors 11-1 . . . 11-4, and where the output port of the cascode circuits is the collector of the first transistor 16-1. Equivalent cascode circuits are formed by the second transistor 17-1 and the transistors of the second group of transistors 12-1 . . 12-4, which are connected via signal output 4-$b$ of the multi-band mixer 3. The switchable VGA 5-1 further comprises a third and fourth transistor 18-1 and 19-1, the bases of which are connected to the bias signal input V_Bias-1$a$, and the collectors of which are connected to a waste branch Vss. The bias signal inputs V_Bias-1$a$ and V_Bias-1$b$ thus form a differential bias signal input V_Bias-1 that allows both to control the gain of the switchable VGA 5-1 and to switch the switchable VGA 5-1 on and off. Finally, the emitter of third transistor 18-1 is connected to the emitter of the first transistor 16-1, and the emitter of the fourth transistor 19-1 is connected to the emitter of the second transistor 17-1.

The second VGA 5-2 has an equivalent set-up with a first transistor 16-2, a second transistor 17-2, a third transistor 18-2 and a fourth transistor 19-2, where the negative signal output is denoted as RF_M-2, the positive signal output is denoted as RF_P-2 and the differential bias signal inputs are denoted as V_Bias-2$a$ and V_Bias-2$b$. Note that due to the adaptation of the VGAs 5-1 and 5-2 to different frequency bands, the parameters of the transistors 16-1 . . . 19-1 and 16-2 . . . 19-2 might substantially differ.

Further note that the input signals of both switchable VGAs 5-1 and 5-2, i.e. the signal outputs 4-$a$ and 4-$b$ of the multi-band mixer 3, are the same. The bias signal inputs V_Bias-1$a/b$ and V_Bias-2$a/b$ now can be used to switch both VGAs on and off and thus to control which of both VGAs amplifies the output signal 4-$a$, 4-$b$ of the multi-band mixer 3 and produces an output at the VGA outputs RF_P and RF_M. E.g., if the voltage of both V_Bias-1$a$ and V_Bias-1$b$ is zero, the VGA 5-1 is switched off. To switch on VGA 5-1, the voltage of both V_Bias-1$a$ and V_Bias-1$b$ has to be so high that the whole cascode is biased correctly (typically 2 Volts). In the case that VGA 5-2 is switched off and VGA 5-1 is switched on, if both voltages of V-Bias-1$a$ and V_Bias-1$b$ are equal, then RF current from output signals 4-$a$ and 4-$b$ of the multi-band mixer 3 are divided equally to the wanted signal outputs of VGA 5-1 (RF_P-1 and RF_M-1) and the waste branch Vss. The current gain of the VGA 5-1 then amounts 0.5. If the voltage of V_Bias-1$a$ is higher than the voltage of V_Bias-1$b$ then most of the RF current from the output signals 4-$a$ and 4-$b$ goes to the waste branch Vss, and if the voltage of V_Bias-1$b$ is higher than the voltage of V_Bias-1$a$, most of the RF current goes to the signal outputs RF_P-1 and RF_M-1. Thus if VGA 5-1 is switched on and VGA 5-2 is switched off, current from the output signals 4-$a$ and 4-$b$ of the multi-band mixer 3 is divided between the signal outputs RF_P-1 and RF_M-1 and the waste branch Vss. The maximum current gain of the VGA 5-1 is 1 when all RF current is driven to the signal outputs RF_P-1 and RF_M-1, and maximum attenuation is achieved when all RF current is driven to the waste branch. The differential bias signal input V_Bias-1 thus allows both to switch the VGA 5-1 on and off and to control its gain factor. The same switching and gain control functionality is available for VGA 5-2 by properly selecting the bias signals at the inputs V_Bias-2$a/b$.

Note that the collectors of the first (11-1 . . . 11-4) and second (12-1 . . . 12-4) group of transistors of the multi-band mixer 3 represent the outputs of the multi-band mixer 3. A collector of a transistor can be modelled as a controllable current source. Thus the multi-band mixer has a current mode output (4-$a$, 4-$b$). The collectors are connected to the VGAs 5-1 and 5-2 in parallel, so that there are no switches in the RF signal path: The RF current finds it way to the VGA 5-1 or 5-2 which is switched on.

The invention has been described above by means of a preferred embodiment. It should be noted that there are alternative ways and variations which will be evident to any person skilled in the art and can be implemented without deviating from the scope and spirit of the appended claims, e.g. the signal may be transferred to more than two target frequency bands by the multi-band mixer, and frequency conversion from an intermediate frequency band to target RF frequency bands may be performed instead of transferring signals from base-band. Various other types of modulations may be represented by the I/Q-modulated base-band signals, such as all kinds of Phase-Shift Keying (PSK) modulation.

The invention claimed is:

1. Device for frequency conversion, comprising:
   exactly one multi-band mixer with means for transferring a signal that is applied to a signal input of said multi-band mixer from a source frequency band of said signal to one out of a plurality of target frequency sub-bands at a time, yielding a transferred signal at a signal output of said multi-band mixer, wherein said plurality of target frequency sub-bands define at least a first target frequency band and a second target frequency band, and wherein said multi-band mixer comprises a first group of transistors and a second group of transistors; and
   a bank of switchable variable gain amplifiers for amplifying said transferred signal, wherein for each of said at least first target frequency band and said second target frequency band, a corresponding switchable variable gain amplifier is provided that is adapted to said corresponding target frequency band and is connected to the signal output of said multi-band mixer, wherein each of said switchable variable gain amplifiers comprises a first transistor and a second transistor, wherein an emitter of said first transistor of each of said switchable variable gain amplifiers is connected to collectors of all the transistors of said first group of transistors of said multi-band mixer in the form of a cascode circuit, and wherein an emitter of said second transistor of each of said switchable variable gain amplifiers is connected to collectors of all the transistors of said second group of transistors of said multi-band mixer in the form of a cascode circuit.

2. Device according to claim 1, wherein the device further comprises means for controlling the switching of said switchable variable gain amplifiers in said bank of variable gain amplifiers so that only the variable gain amplifier that is adapted to said target frequency band that contains the target frequency sub-band the signal has been transferred to has an amplification factor larger than zero and so that all other variable gain amplifiers in said bank of variable gain amplifiers have an amplification factor equal or close to zero.

3. Device according to claim 2,
   wherein bases of said first transistor and second transistor of each of said switchable variable gain amplifiers are connected to said means for controlling the switching of said switchable variable gain amplifiers, respectively.

4. Device according to claim 2,
   wherein each of said switchable variable gain amplifiers further comprises a third transistor and a fourth transistor and a waste branch,
   wherein collectors of said third transistor and said fourth transistors are connected to said waste branch,
   wherein emitters of said third transistor and said fourth transistor are connected to the emitters of said first transmitter and said second transistor, respectively,
   wherein bases of said third transistor and said fourth transistor are connected to said means for controlling switching of said switchable variable gain amplifiers,
   wherein bases of said first transistor and said second transistor are connected to said means for controlling the switching of said switchable variable gain amplifiers, and
   wherein emitters of all said first group of transistors and said second group of transistors of said multi-band mixer are connected to ground directly or by means of further electronic components.

5. Device according to claim 1,
   wherein the device further comprises a bank of power amplifiers, and
   wherein for each of said target frequency bands, a corresponding power amplifier is provided that is adapted to said corresponding target frequency band and is connected to a signal output of the switchable variable gain amplifier.

6. Device according to claim 1,
   wherein said signal is an I/Q-modulated base-band signal, and
   wherein said multi-band mixer comprises means for combining said I/Q-modulated base-band signal with sinusoids the frequency of which corresponds to said target frequency sub-band.

7. Device according to claim 6,
   wherein bases of the transistors of said first group of transistors and of said second group of transistors of said multi-band mixer are modulated with signals that are generated by circuitry that combines said sinusoids with said I/Q-modulated base-band signal.

8. Device according to claim 1, wherein said multi-band mixer comprises a tuneable voltage-controlled oscillator and a phase-locked loop circuit.

9. Method for frequency conversion, comprising:
   transferring a signal that is applied to a signal input of a multi-band mixer from a source frequency band of said signal to one out of a plurality of target frequency sub-bands at a time, yielding a transferred signal at the signal output of said multi-band mixer, wherein said plurality of target frequency sub-bands defines a plurality of target frequency bands including at least a first target frequency band and a second target frequency band, and wherein said multi-band mixer comprises a first group of transistors and a second group of transistors; and
   amplifying said transferred signal in the bank of switchable variable gain amplifiers, wherein for each of said target frequency bands, a corresponding switchable variable gain amplifier is provided that is adapted to said corresponding target frequency band and is connected to the signal output of said multi-band mixer wherein each of said switchable variable gain amplifiers comprises a first transistor and a second transistor, wherein an emitter of said first transistor of each of said switchable variable gain amplifiers is connected to collectors of all the transistors of said first group of transistors of said multi-band mixer in the form of a cascode circuit, and wherein an emitter of said second transistor of each of said switchable variable gain amplifiers is connected to collectors of all the transistors of said second group of transistors of said multi-band mixer in the form of a cascode circuit.

10. Method according to claim 9, wherein the method further comprise controlling a switching of said switchable variable gain amplifiers in said bank of variable gain amplifiers so that only a variable gain amplifier that is adapted to a target frequency band that contains a target frequency sub-band the signal has been transferred to has an amplification factor larger than zero and so that all other variable gain amplifiers in said bank of variable gain amplifiers have an amplification factor equal or close to zero.

11. Method according to claim 9,
    wherein said signal is an I/Q-modulated base-band signal, and wherein said I/Q-modulated base-band signal is combined in said multi-band mixer with sinusoids with frequency corresponding to said target frequency sub-band.

12. Device, comprising:

a multi-band mixer, responsive to a signal from a filter, for providing a transferred signal;

a first variable gain amplifier, responsive to said transferred signal and to a first bias input signal, for providing a first amplified transferred signal;

a second variable gain amplifier, responsive to said transferred signal and to a second bias input signal, for providing a second amplified transferred signal;

a first power amplifier, responsive to said first amplified transferred signal, for providing a first transmitted signal; and a second power amplifier, responsive to said second amplified transferred signal, for providing a second transmitted signal wherein said multi-band mixer comprises a first group of transistors and a second group of transistors;

wherein each of said first variable gain amplifier and said second variable gain amplifier comprises a first transistor and a second transistor;

wherein an emitter of said first transistor of each of said variable gain amplifiers is connected to collectors of all the transistors of said first group of transistors of said multi-band mixer in the form of a cascode circuit; and wherein an emitter of said second transistor of each of said variable gain amplifiers is connected to collectors of all the transistors of said second group of transistors of said multi-band mixer in the form of a cascode circuit.

13. Device, comprising:

a multi-band mixer, responsive to an input signal in a source frequency band, for transferring said input signal to one out of a plurality of target frequency sub-bands at a time, for providing a transferred signal, wherein said plurality of target frequency sub-bands defines a plurality of target frequency bands including at least a first target frequency band and a second target frequency band, and wherein said multi-band mixer comprises a first group of transistors and a second group of transistors; and a bank of switchable variable gain amplifiers, responsive to said transferred signal, wherein for each of said target frequency bands, a corresponding switchable variable gain amplifier is provided adapted to said corresponding target frequency band, for providing an amplified transferred signal corresponding to said one out of said plurality of target frequency sub-bands for transmission at said time wherein each of said switchable variable gain amplifiers comprises a first transistor and a second transistor, wherein an emitter of said first transistor of each of said switchable variable gain amplifiers is connected to collectors of all the transistors of said first group of transistors of said multi-band mixer in the form of a cascode circuit, and wherein an emitter of said second transistor of each of said switchable variable gain amplifiers is connected to collectors of all the transistors of said second group of transistors of said multi-band mixer in the form of a cascode circuit.

14. Device according to claim 13, wherein each switchable variable gain amplifier in said bank of variable gain amplifiers is responsive to a corresponding control signal for controlling a respective variable gain amplifier so that only a variable gain amplifier that is adapted to a target frequency band that contains a target frequency sub-band the input signal has been transferred to has an amplification factor larger than zero and so that all other variable gain amplifiers in said bank of variable gain amplifiers have an amplification factor equal or close to zero.

15. Device, comprising:

means for transferring a signal that is applied to a signal input thereof from a source frequency band of said signal to one out of a plurality of target frequency sub-bands at a time, yielding a transferred signal at the signal output of said means for transferring, wherein said plurality of target frequency sub-bands defines a plurality of target frequency bands including at least a first target frequency band and a second target frequency band; and means for amplifying said transferred signal, wherein for each of said target frequency bands, said means for amplifying is adaptable to said corresponding target frequency band for providing an amplified transferred signal with a gain corresponding to said one out of said plurality of target frequency sub-bands for transmission at said time, wherein said means for amplifying comprises a bank of switchable variable gain amplifiers, wherein said means for transferring comprises a first group of transistors and a second group of transistors;

wherein each of said switchable variable gain amplifiers of said means for amplifying comprises a first transistor and a second transistor;

wherein an emitter of said first transistor of each of said switchable variable gain amplifiers is connected to collectors of all the transistors of said first group of transistors of said means for transferring in the form of a cascode circuit; and wherein an emitter of said second transistor of each of said switchable variable gain amplifiers is connected to collectors of all the transistors of said second group of transistors of said means for transferring in the form of a cascode circuit.

\* \* \* \* \*